(12) United States Patent
Kimizuka

(10) Patent No.: US 6,380,594 B1
(45) Date of Patent: Apr. 30, 2002

(54) SEMICONDUCTOR DEVICE

(75) Inventor: Naohiko Kimizuka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/688,696

(22) Filed: Oct. 17, 2000

(30) Foreign Application Priority Data

Oct. 19, 1999 (JP) ............................................ 11-297397

(51) Int. Cl.[7] ................................................ H01L 29/76
(52) U.S. Cl. ........................ 257/371; 257/368; 438/223
(58) Field of Search ................................ 257/368, 371, 257/392, 357

(56) References Cited

U.S. PATENT DOCUMENTS 6,307,234 B1 * 10/2001 Ito et al.

FOREIGN PATENT DOCUMENTS

| JP | 64-61048 | 8/1989 |
| JP | 4-250663 | 9/1992 |
| JP | 9-237131 | 9/1997 |
| JP | 11-111978 | 4/1999 |

\* cited by examiner

*Primary Examiner*—David Nelms
*Assistant Examiner*—Andy Huynh
(74) *Attorney, Agent, or Firm*—Young & Thompson

(57) ABSTRACT

First and second circuit blocks are provided in a semiconductor device. The first circuit block is provided with a first complementary MOS transistor including a first P-channel MOS transistor and a first N-channel MOS transistor. The second circuit block is provided with a second complementary MOS transistor including a second P-channel MOS transistor and a second N-channel MOS transistor. The threshold voltages of the first P-channel MOS transistor and the first N-channel MOS transistor are set to be higher than those of the second P-channel MOS transistor and the second N-channel MOS transistor. A gate leakage current of the first N-channel MOS transistor in a stand-by state is set to be substantially equal to that of the first P-channel MOS transistor.

12 Claims, 7 Drawing Sheets

SEMICONDUCTOR DEVICE

BACKGROUND OF THE INVENTION

1. Field of the Invention

The present invention relates to a semiconductor device suitable for use in a battery-driven device such as a portable telephone, and more particularly to a semiconductor device which realizes reduced power consumption in a stand-by state.

2. Description of the Related Art

In general, a receiving circuit to which a power is supplied even in a stand-by state waiting for an external signal and an internal circuit to which no power is supplied in the stand-by state are incorporated into a battery-driven device such as a portable telephone and a notebook-sized personal computer. A plurality of complementary MOS (CMOS) transistors are incorporated into the receiving circuit and the internal circuit, and these transistors are fabricated by substantially the same fabrication process. Therefore, the thickness of gate oxide films of N-channel MOS transistors and P-channel MOS transistors respectively forming these CMOS transistors are substantially the same. In general, the thickness of the gate oxide film is about 50Å. Low power consumption is desired for the receiving circuit, and a high-speed operation is desired for the internal circuit. Therefore, the threshold value of the CMOS transistor in the receiving circuit is set to be higher than that in the internal circuit. Such an adjustment of the threshold value is done by adjusting the conditions for implanting channel ions into a well.

In recent years, the operating voltage of the entire device has been reduced in order to reduce power consumption, changing from 5 V to 3.2 V and then to 1 V. However, if the operating voltage of the device is simply reduced, the operation speed thereof is also reduced. Therefore, by reducing the threshold value and the thickness of the gate oxide film, the operation speed is maintained.

However, there is a limit in reducing the threshold value. Although an adjustment for maintaining the operation speed is mainly performed by reducing the thickness of the gate oxide film, a reduction in the thickness of the gate oxide film results in a great increase in a gate leakage current. Since the gate leakage current flows from a gate to a substrate even in the stand-by state, power consumption of the receiving circuit in the stand-by state is increased.

FIG. 1 is a graph showing the relations between a gate voltage and a gate leakage current in various gate oxide film thicknesses. The horizontal axis of the graph shows a gate voltage, and the vertical axis thereof shows a gate leakage current. As shown in FIG. 1, as the gate voltage is increased or the gate oxide film thickness is reduced, the gate leakage current is increased. Accordingly, the gate leakage current greatly depends on the thickness of the gate oxide film. For example, as shown in FIG. 1, if the thickness of the gate oxide film is reduced by 4 Å, the gate leakage current is increased by about 1 to 1.5 orders of magnitude when the gate voltage is 1.2 V.

FIG. 2 is a circuit diagram showing an inverter chain provided in the receiving circuit. An inverter 101 consisting of a P-channel MOS transistor 101p and an N-channel MOS transistor 101n is connected to an inverter 102 consisting of a P-channel MOS transistor 102p and an N-channel MOS transistor 102n. The P-channel MOS transistors 101p and 102p are connected to a power supply interconnect line, and the N-channel MOS transistors 101n and 102n are connected to a ground interconnect line.

In the thus-structured inverter chain, when a low signal is supplied to a gate of the inverter 101, not only a subthreshold leakage current but also a gate leakage current as described above flow. The subthreshold leakage current is indicated by a two-dot chain line, and the gate leakage current is indicated by a dashed line. In general, the gate leakage current in the N-channel MOS transistor is greater than that in the P-channel MOS transistor by about 1 to 1.5 orders of magnitude, reflecting the difference between the band structures of the respective MOS transistors.

FIG. 3 is a graph showing the relation of a gate leakage current and a drain current to a gate voltage in the CMOS transistor. In FIG. 3, a solid line shows the gate leakage current of a P-channel MOS transistor, and a dashed line shows the gate leakage current of an N-channel MOS transistor. A one-dot chain line shows the drain current of the P-channel MOS transistor, and a two-dot chain line shows the drain current of the N-channel MOS transistor. FIG. 4 is a band diagram showing the potential relation between a gate electrode and a drain electrode of the N-channel MOS transistor.

In general, the threshold values of the N-channel MOS transistor and the P-channel MOS transistor together consisting of a single CMOS transistor are set to be substantially the same. Therefore, as shown in FIG. 3, when the gate voltage is 0 V, the drain current of the N-channel MOS transistor is equal to that of the P-channel MOS transistor. On the other hand, the gate leakage current in the N-channel MOS transistor is greater than that in the P-channel MOS transistor as described above.

As shown in FIG. 4, a gate-induced drain leakage (GIDL) current also flows. FIG. 5 is a schematic diagram showing a mechanism of a gate-induced drain leakage (GIDL) current. As shown in an arrow A in FIG. 5, the gate-induced drain leakage our (GIDL) occurs in a portion 106 overlapping with-a gate electrode 105 in the cross-sectional view when a power supply potential VDD is supplied to a drain diffusion layer 104 in an N-channel MOS transistor 103.

SUMMARY OF THE INVENTION

The object of the present invention is to provide a semiconductor device capable of reducing power consumption while maintaining a desired operation speed thereof.

According to one aspect of the present invention, a semiconductor device comprises a first circuit block to which a power is supplied during an operation thereof and in a stand-by state. The first circuit block comprises a first complementary MOS transistor including a first P-channel MOS transistor and a first N-channel MOS transistor. A gate leakage current of the first N-channel MOS transistor in the stand-by state is set to be substantially equal to a gate leakage current of the first P-channel MOS transistor in the stand-by state.

According to another aspect of the present invention, a semiconductor device comprises a first circuit block, and a second circuit block that operates at a speed higher than that of the first circuit block. The first circuit block comprises a first complementary MOS transistor including a first P-channel MOS transistor and a first N-channel MOS transistor. A gate leakage current of the first N-channel MOS transistor in a stand-by state is set to be substantially equal to a gate leakage current of the first P-channel MOS transistor in the stand-by state.

According to another aspect of the present invention a semiconductor device comprises a first circuit block comprising a first complementary MOS transistor including a first P-channel MOS transistor and a first N-channel MOS transistor, and a second circuit block comprising a second complementary MOS transistor including a second P-channel MOS transistor and a second N-channel MOS transistor. Threshold voltages of the first P-channel MOS transistor and the first N-channel MOS transistor are set to be higher than those of the second P-channel MOS transistor and the second N-channel MOS transistor. A gate leakage current of the first N-channel MOS transistor in a stand-by state is set to be substantially equal to that of the first P-channel MOS transistor.

The thickness of the gate oxide film of the first P-channel MOS transistor is preferably in the range of 20 to 24 Å, and the thickness of the gate oxide film of the first N-channel MOS transistor is preferably in the range of 25 to 29 Å.

According to these aspect of the present invention, since the gate leakage current of the first N-channel MOS transistor in the stand-by state is set to be substantially equal to that of the first P-channel MOS transistor, it is possible to significantly reduce power consumption in the stand-by state, which conventionally has been caused mainly by the gate leakage current of the N-channel MOS transistor. Moreover, since a conventional P-channel MOS transistor may be used as the first P-channel MOS transistor, the driving force thereof is maintained, thereby maintaining the operation speed of a semiconductor device in which theses transistors are provided.

The nature, principle, and utility of the invention will become more apparent from the following detailed description when read in conjunction with the accompanying drawings in which like parts are designated by like reference numerals or characters.

DETAILED DESCRIPTION OF THE PREFERRED EMBODIMENT

Figure 1:
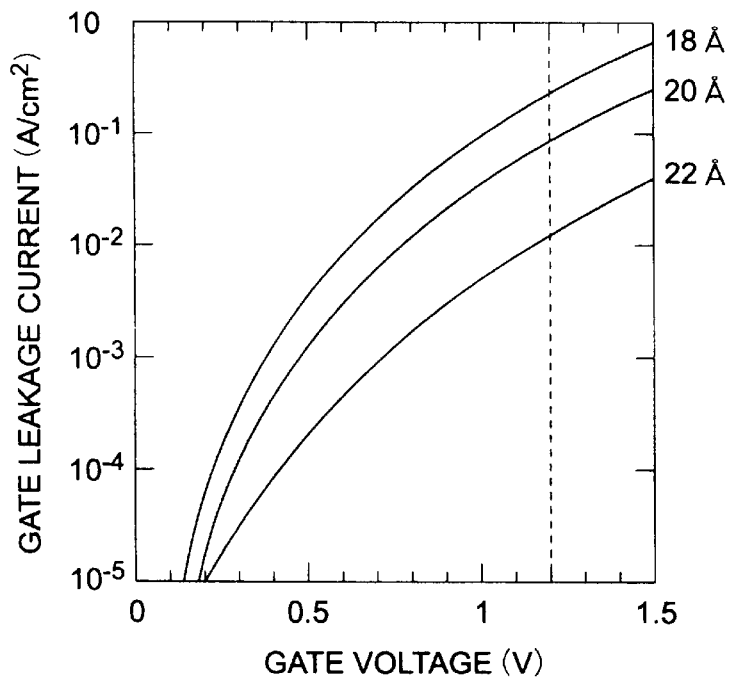
FIG. 1 is a graph showing the relations between a gate voltage and a gate leakage current in various gate oxide film thicknesses.
Figure 2:
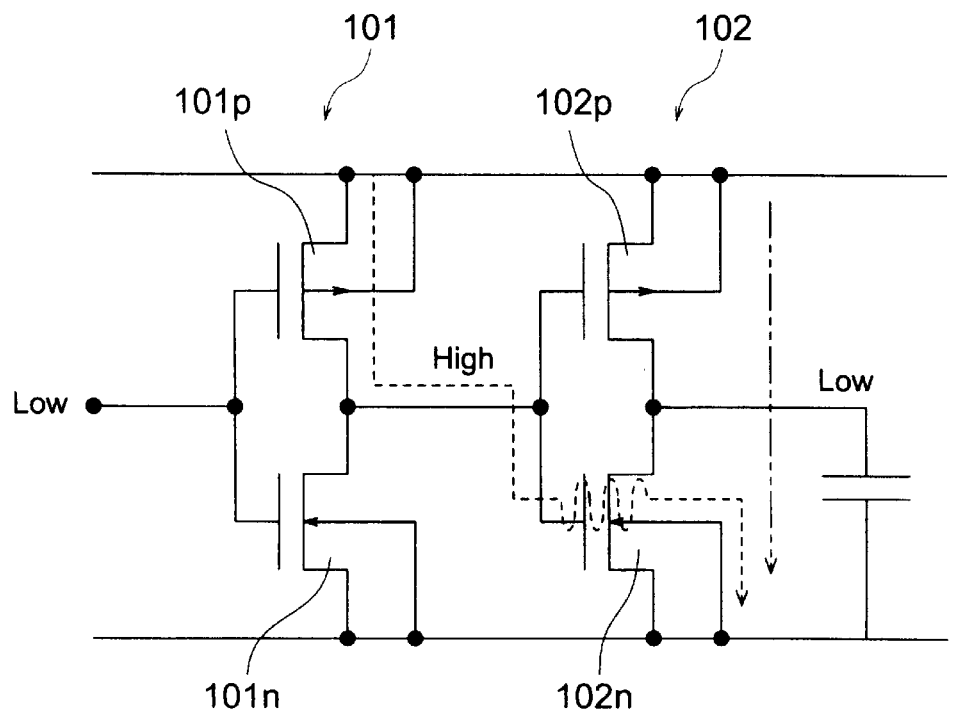
FIG. 2 is a circuit diagram showing an inverter chain provided in a receiving circuit.
Figure 3:
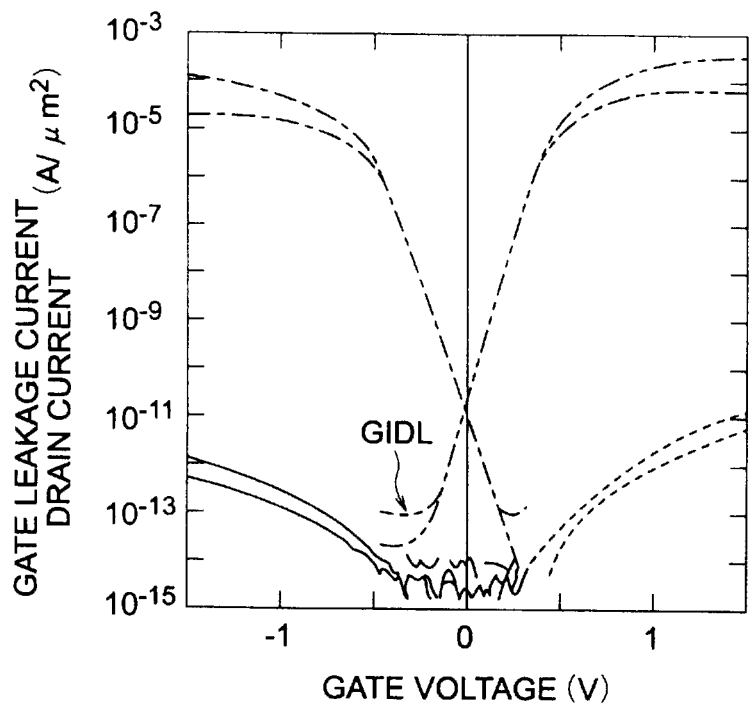
FIG. 3 is a graph showing the relation of a gate leakage current and a drain current to a gate voltage in a CMOS transistor.
Figure 4:
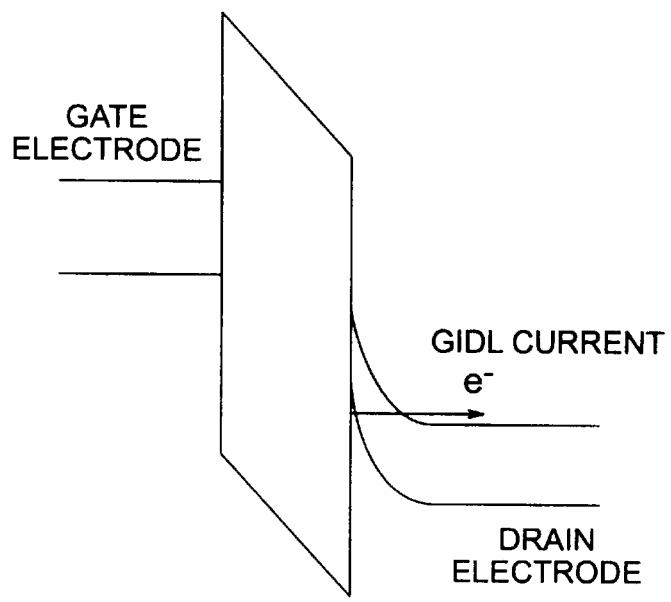
FIG. 4 is a band diagram showing the potential relation between a gate electrode and a drain electrode of an N-channel MOS transistor.
Figure 5:
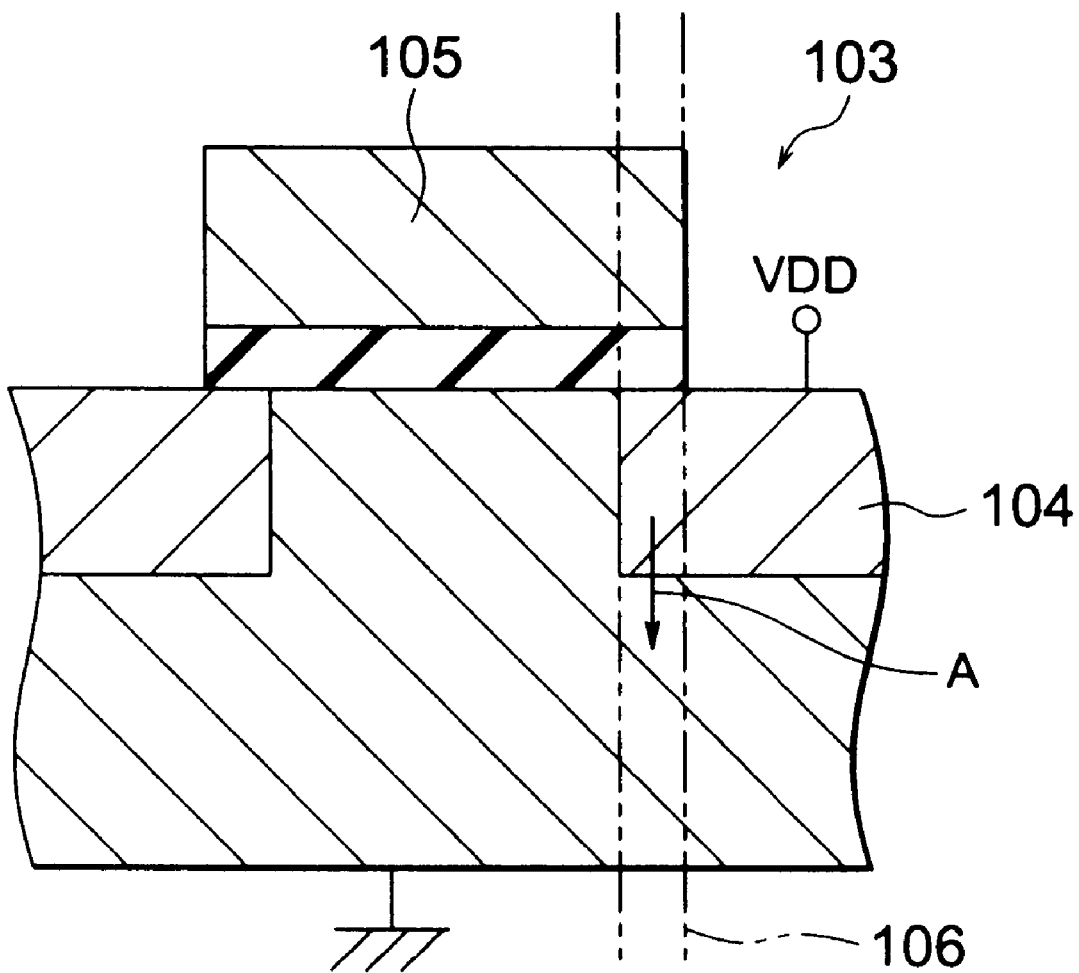
FIG. 5 is a schematic diagram showing a mechanism of a gate-induced drain leakage (GIDL) current.
Figure 6:
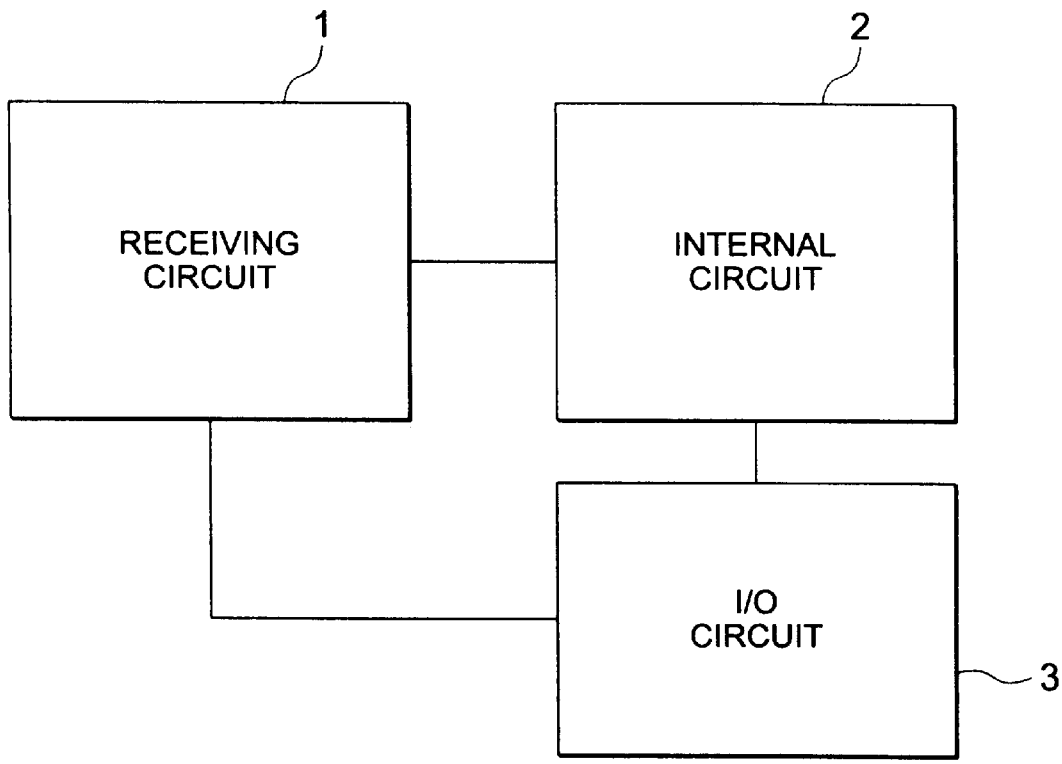
FIG. 6 is a block diagram showing a semiconductor device according to the first embodiment of the present invention.
Figure 7:
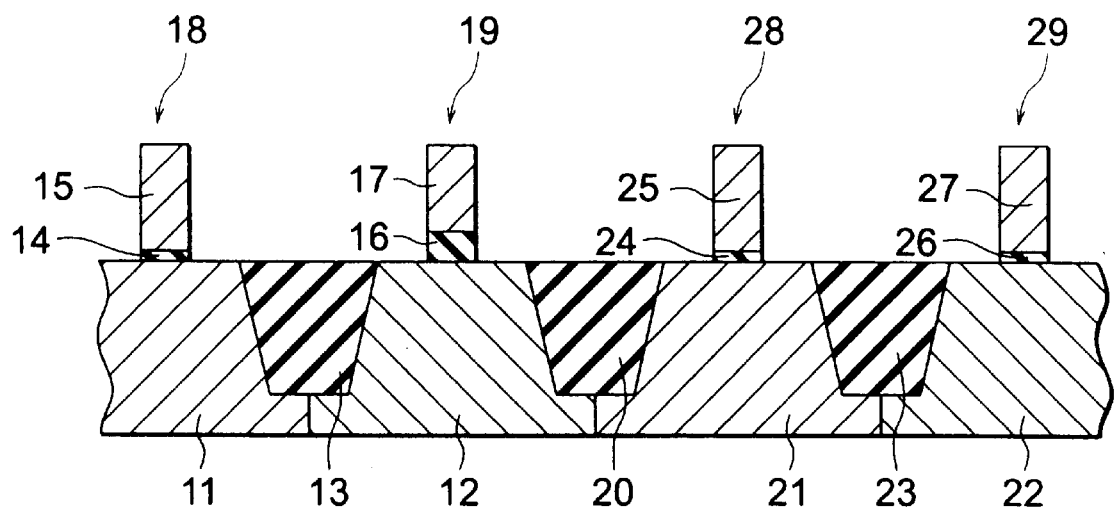
FIG. 7 is a cross-sectional view showing the semiconductor device according to the first embodiment of the present invention.

The preferred embodiments of the present invention will be described below specifically with reference to the accompanying drawings. FIG. 6 is a block diagram showing a semiconductor device according to a first embodiment of the present invention, and FIG. 7 is a cross-sectional view showing the semiconductor device according to the first embodiment of the present invention.

In the first embodiment of the present invention, as shown in FIG. 6, there is provided a receiving circuit (a first circuit block) 1 for receiving a signal transmitted from the outside. Even in the stand-by state, a power is supplied to the receiving circuit 1, and the receiving circuit 1 starts to operate when it receives an external signal. Thus, the receiving circuit 1 is a constantly-operating circuit in an LSI, for example, which is used in a battery-driven apparatus. An internal circuit (a second circuit block) 2 is also provided. The internal circuit 2 starts to operate taking starting of the operation of the receiving circuit 1 as a trigger. No power is supplied to the internal circuit 2 in the stand-by state. A plurality of complementary MOS (CMOS) transistors are provided in the receiving circuit 1 and the internal circuit 2.

The receiving circuit 1 and the internal circuit 2 are mounted on a single chip. An input/output (I/O) circuit 3 for exchanging signals with an external circuit is further provided on the chip. Such a signal exchange with an external circuit is conducted via the I/O circuit 3. More specifically, a signal input to the I/O circuit 3 from the outside is input to the receiving circuit 1. If the signal includes an instruction which instructs the internal circuit 2 to start its operation, a power is supplied to the internal circuit 2 via the control of the receiving circuit 1. If the signal input from the outside includes an instruction which instructs the internal circuit 2 to stop its operation, a power supply to the internal circuit 2 is ceased via the control of the receiving circuit 1.

In general, the I/O circuit 3 is operated by a high supply voltage, e.g., 3 V, and the receiving circuit 1 and the internal circuit 2 are operated by a low supply voltage, e.g., 1.8 V. In other words, a supply voltage higher than that of the receiving circuit 1 and the internal circuit 2 is supplied to the I/O circuit 3. The chip of the present embodiment on which the receiving circuit 1, the internal circuit 2, and the I/O circuit 3 are mounted may be driven by a battery power supply.

As shown in FIG. 7, in a CMOS transistor in the receiving circuit 1, an N-well 11 and a P-well 12 are defined from each other by a device separation insulating film 13. A gate oxide film 14 and a gate electrode 15 are sequentially stacked on the N-well 11, and a gate oxide film 16 and a gate electrode 17 are sequentially stacked on the P-well 12. The thickness of the gate oxide film 16 is greater than that of the gate oxide film 14. For example, the thickness of the gate oxide film 16 is in the range of 24 to 29 Å, and the thickness of the gate oxide film 14 is in the range of 20 to 25 Å. The thickness of the gate oxide film 14 is set to be sufficient to obtain the minimum operation speed required for the receiving circuit 1.

If the thickness of the gate oxide films is smaller than the above-described values, it is difficult to realize a stable fabrication at present. On the other hand, if the thickness of the gate oxide films is greater than these values, the driving force of the receiving circuit 1 is reduced. Therefore, although the power consumption is reduced, an adverse effect resulting from the reduction in the operation speed is increased. Thus, the thickness of the gate oxide films is preferably within the above-described ranges.

A P-type source-drain diffusion layer (not shown) is formed on the surface of the N-well 11, and an N-type source-drain diffusion layer (not shown) is formed on the surface of the P-well 12. A P-channel MOS transistor 18 and an N-channel MOS transistor 19 are thus formed.

In a CMOS transistor in the internal circuit 2, an N-well 21 and a P-well 22 are defined from each other by a device separation insulating film 23. A gate oxide film 24 and a gate electrode 25 are sequentially stacked on the N-well 21, and a gate oxide film 26 and a gate electrode 27 are sequentially stacked on the P-well 22. The thickness of each of the gate oxide films 24 and 26 is approximately equal to that of the gate oxide film 14, for example. A P-type source-drain diffusion layer (not shown) is formed on the surface of the N-well 21, and an N-type source-drain diffusion layer (not shown) is formed on the surface of the P-well 22. A P-channel MOS transistor 28 and an N-channel MOS transistor 29 are thus formed.

The receiving circuit 1 and the internal circuit 2 are defined from each other by a device separation insulating film 20.

The threshold value of the transistor 18 is approximately equal to that of the transistor 19, and the threshold value of the transistor 28 is approximately equal to that of the transistor 29. The threshold values of the transistors 18 and 19 are set to be higher than those of the transistors 28 and 29. For example, boron ions are implanted into a channel of the transistor 19 with an acceleration voltage of 30 keV and a dose of $2 \times 10^{13}$ cm$^{-2}$, and boron ions are implanted into a channel of the transistor 29 with an acceleration voltage of 30 keV and a dose of $1.5 \times 10^{13}$ cm$^{-2}$.

Figure 8:
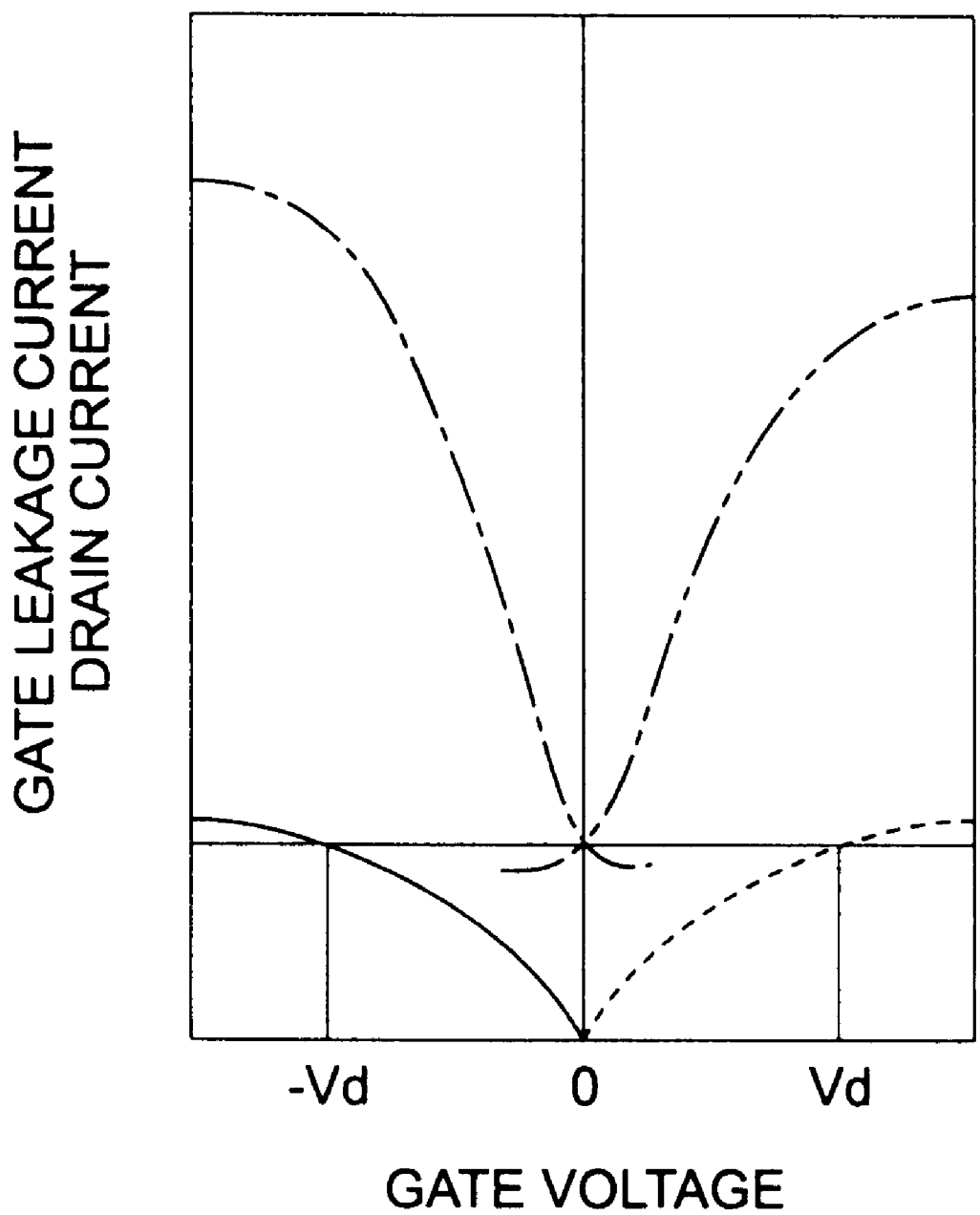
FIG. 8 is a schematic diagram showing the relation of a gate leakage current and a drain current to a gate voltage in a receiving circuit 1.

In the receiving circuit 1, the gate leakage current of the transistor 18 in the stand-by state is set to be equal to that of the transistor 19 in the stand-by state. The "stand-by state" refers to a state in which the device is not operating with no external signal being input thereto. In such a state, a gate voltage is a supply voltage, for example. The magnitude of the gate leakage current in this stand-by state coincides with the sub-threshold leakage current when the gate voltage of the transistors 18 and 19 is equal to 0 V, for example. FIG. 8 is a schematic diagram showing the relation of a gate leakage current and a drain current to a gate voltage in the receiving circuit 1. In FIG. 8, a solid line shows the gate leakage current of the P-channel MOS transistor 18, and a dashed line shows the gate leakage current of the N-channel MOS transistor 19. A one-dot chain line shows the drain current of the P-channel MOS transistor 18, and a two-dot chain line shows the drain current of the N-channel MOS transistor 19. The drain current is measured by setting the source voltage and the substrate voltage to 0 V and setting the drain voltage to the supply voltage $V_{DD}$. The gate leakage current is measured by setting the source voltage, the drain voltage, and the substrate voltage to 0 V.

In the thus-structured semiconductor device of the present embodiment, the threshold values of the transistors 18 and 19 in the receiving circuit 1 are set to be higher than those of the transistors 28 and 29 in the internal circuit 2, respectively, as described above. Therefore, power consumption during the operation of the receiving circuit 1 is lower than that in the internal circuit 2, and the operation speed of the internal circuit 2 is higher than that of the receiving circuit 1. In the stand-by state, a power is not supplied to the internal circuit 2, but supplied to the receiving circuit 1. However, since the gate leakage current of the N-channel MOS transistor 19 in the stand-by state is set to be equal to that of the P-channel MOS transistor 18 in the stand-by state, power consumption in the stand-by state is reduced as compared to that in a conventional case. This effect becomes more prominent as the thickness of the gate oxide films is increasingly reduced.

Figure 9A:
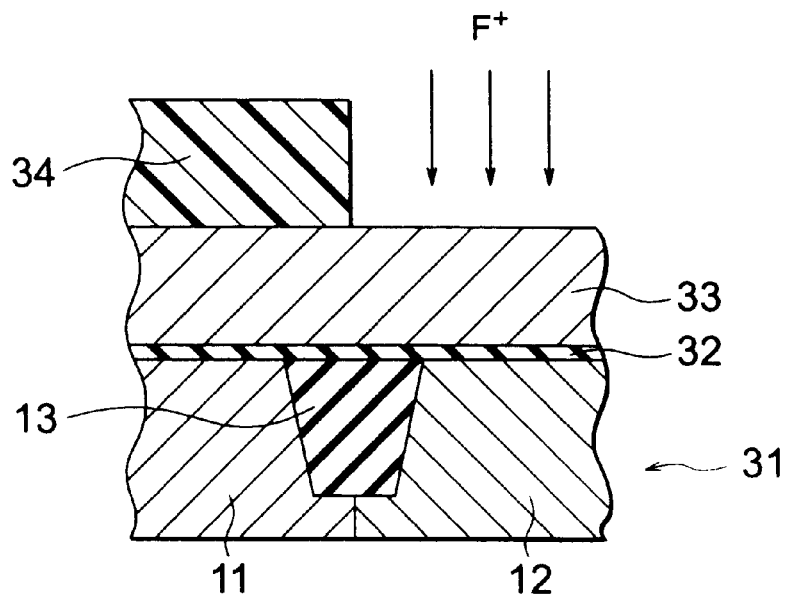
FIG. 9A to FIG. 9C are cross-sectional views sequentially showing steps of fabricating a semiconductor device according to an embodiment of the present invention.
Figure 9B:
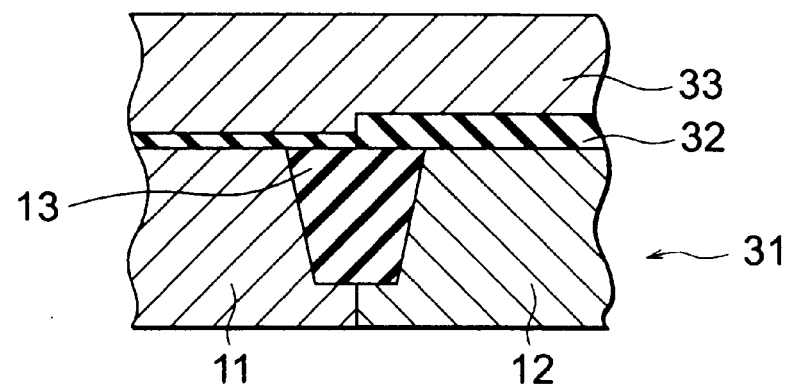
Figure 9C:
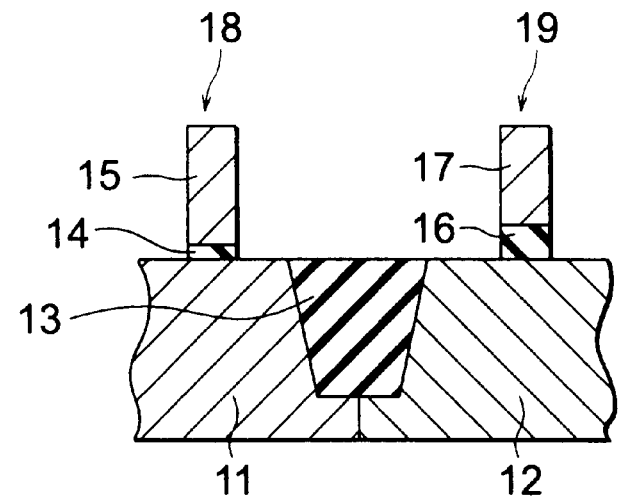

Next, a method for fabricating a semiconductor device of the embodiment as described above will be described. FIG. 9A to FIG. 9C are cross-sectional views sequentially showing steps of fabricating the semiconductor device according to the first embodiment of the present invention. In FIG. 9A to FIG. 9C, only a portion corresponding to the receiving circuit 1 is shown.

First, as shown in FIG. 9A, the N-well 11 and the N-well 21 (not shown in FIG. 9A) and the P-well 12 and the P-well 22 (not shown in FIG. 9A) are formed at the surface of a semiconductor substrate 31. Next, the device separation insulating film 13 and the device separation insulating film 23 (not shown in FIG. 9A) are respectively formed between the N-well 11 and the P-well 12 and between the N-well 21 and the P-well 22. The device separation insulating films 13 and 23 may be formed by trench separation, for example. Next, an oxide film 32 and a polycrystalline silicon film 33 are sequentially provided across the entire surface of the structure. The thickness of the oxide film 32 is in the range of 20 to 25 Å, for example. Next, a photo-resist film 34 having an opening over the P-well 12 is formed on the polycrystalline silicon film 33, and fluoride ions are implanted using the photo-resist film 34 as a mask. The ion implantation is performed, for example, with an acceleration voltage of 20 keV and a dose in the range of about $5 \times 10^{14}$ to about $5 \times 10^{15}$ cm$^{-2}$.

Thereafter, the photo-resist film 34 is removed as shown in FIG. 9B, and a heat treatment is performed thereto so as to diffuse the fluoride ions into the oxide film 32. Consequently, the thickness of the oxide film 32 over the P-well 12 is increased to about 24 to 29 Å.

Next, as shown in FIG. 9C, the polycrystalline silicon film 33 and the oxide film 32 are patterned into a predetermined shape so as to form the gate electrodes 15 and 17 and the gate oxide films 14 and 16 in a region corresponding to the receiving circuit 1 and form the gate electrodes 25 and 27 (not shown in FIG. 9C) and the gate oxide films 24 and 26 (not shown in FIG. 9C) in a region corresponding to the internal circuit 2.

Then, a source-drain diffusion layer, an interlayer insulating film and the like are formed with using a usual fabrication step, thus completing a semiconductor device.

Although fluoride ions are implanted before patterning the polycrystalline silicon film 33 in the above-described method, fluoride ions may be implanted only into the portion of the polycrystalline silicon film 33 located over the P-well 12 after the patterning of the polycrystalline silicon film 33. Alternatively, fluoride ions may be implanted into the semiconductor substrate before the oxide film 32 is formed.

The thickness of the gate oxide films 14 and 16 is adjusted so that the gate leakage current of each of the transistors 18 and 19 in the stand-by state coincides with the drain current when the gate voltage is 0 V in the above-described embodiment. However, the gate leakage current of each of the transistors 18 and 19 does not necessarily need to coincide with the drain current when the gate voltage is 0 V. More specifically, the gate leakage currents of the transistors 18 and 19 may be different from each other as long as the gate leakage current of each of the transistors 18 and 19 is suppressed to be equal to or smaller than the drain current when the gate voltage is 0 V.

Figure 10:
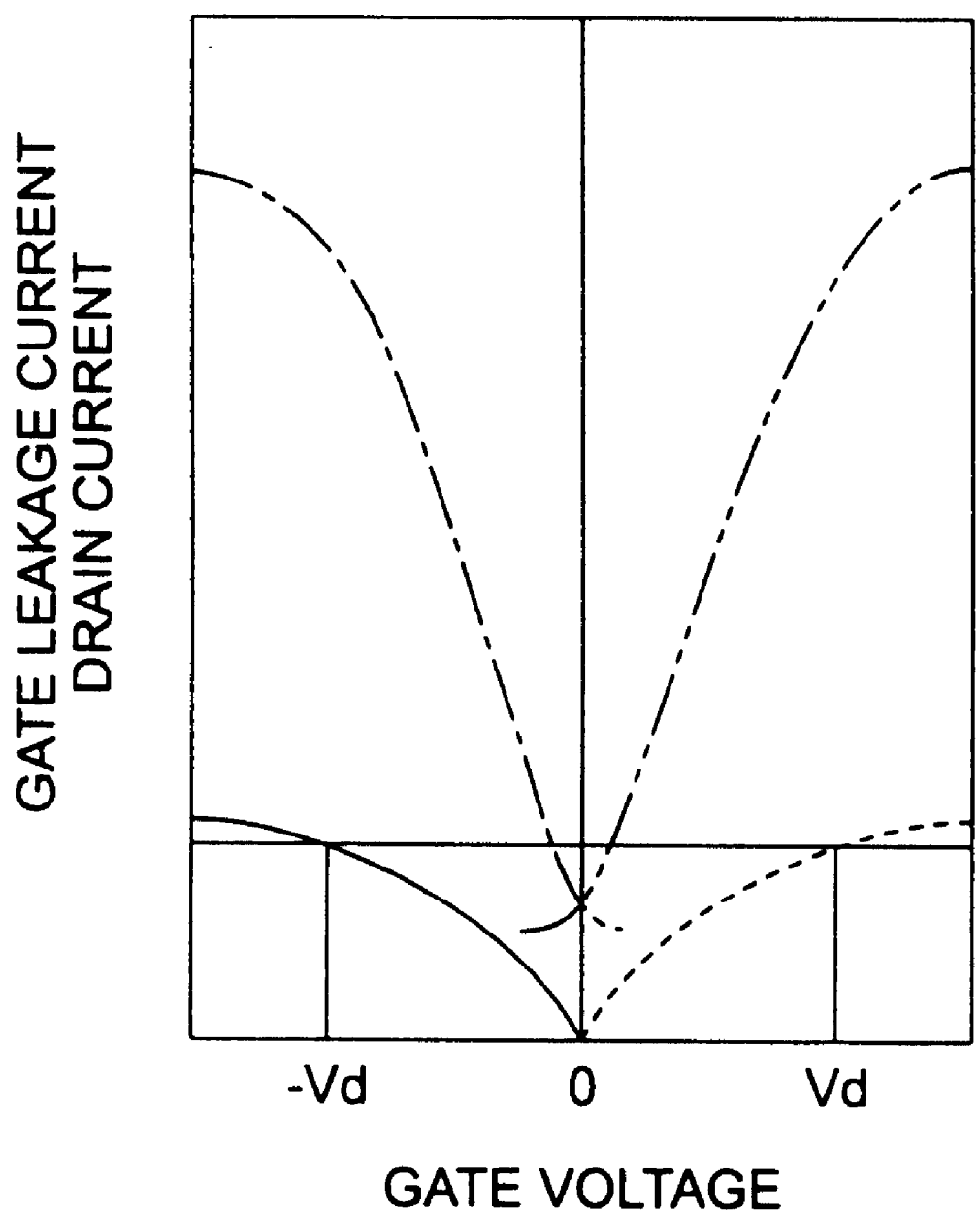
FIG. 10 is a schematic diagram showing the relation of a gate leakage current and a drain current to a gate voltage in a CMOS transistor provided in a receiving circuit of the second embodiment of the present invention.

Next, the second embodiment of the present invention will be described. In the second embodiment, although the thickness of a gate oxide film in a P-channel MOS transistor in a receiving circuit is set to be smaller than that in the first embodiment, i.e., about 12 Å, the other structures, dimensional relations, and the like are the same as those in the first embodiment. FIG. 10 is a schematic diagram showing the relation of a gate leakage current and a drain current to a gate voltage in a CMOS transistor provided in the receiving circuit in the second embodiment of the present invention. In FIG. 10, a solid line shows a gate leakage current of a P-channel MOS transistor, and a dashed line shows a gate leakage current of an N-channel MOS transistor. A one-dot chain line shows a drain current of the P-channel MOS transistor, and a two-dot chain line shows a drain current of the N-channel MOS transistor.

In the second embodiment of the present invention, as shown in FIG. 10, the gate leakage current of each of the N-channel MOS transistor and the P-channel MOS transistor together consisting of a CMOS transistor in the receiving circuit in the stand-by state is higher than the drain current when the gate voltage is 0 V. While the second embodiment is an embodiment where the gate leakage current is allowed to determine power consumption in the receiving circuit, the power consumption can be reduced to about 1/10 by reducing the gate leakage current of the N-channel MOS transistor by an order of magnitude so that it is comparable to that in the P-channel MOS transistor.

While there has been described what is at present considered to be a preferred embodiment of the invention, it will be understood that various modifications may be made thereto, and it is intended that the appended claims cover all such modifications as fall within the true spirit and scope of the invention.

What is claimed is:

1. A semiconductor device, comprising
   a first circuit block to which a power is supplied during an operation thereof and in a stand-by state, said first circuit block comprising a first complementary MOS transistor including a first P-channel MOS transistor and a first N-channel MOS transistor, and a gate leakage current of said first N-channel MOS transistor in the stand-by state being set to be substantially equal to a gate leakage current of said first P-channel MOS transistor in the stand-by state.

2. The semiconductor device according to claim 1, wherein a thickness of a gate oxide film of said first N-channel MOS transistor is greater than that of said first P-channel MOS transistor.

3. The semiconductor device according to claim 2, further comprising a second circuit block to which a power is supplied after said first circuit block starts to operate, said second circuit block comprising a second complementary MOS transistor including a second P-channel MOS transistor and a second N-channel MOS transistor, and each of said second P-channel MOS transistor and said second N-channel MOS transistor comprising a gate oxide film having a thickness substantially equal to that of said gate oxide film of said first P-channel MOS transistor.

4. A semiconductor device, comprising:
   a first circuit block having a first complementary MOS transistor including a first P-channel MOS transistor and a first N-channel MOS transistor, a gate leakage current of said first N-channel MOS transistor in a stand-by state being set to be substantially equal to a gate leakage current of said first P-channel MOS transistor in the stand-by state; and
   a second circuit block which operates at a speed higher than that of the first circuit block.

5. The semiconductor device according to claim 4, wherein a thickness of a gate oxide film of said first N-channel MOS transistor is greater than that of said first P-channel MOS transistor.

6. The semiconductor device according to claim 5, wherein
   said second circuit block comprises a second complementary MOS transistor including a second P-channel MOS transistor and a second N-channel-MOS transistor, and
   each of said second P-channel MOS transistor and said second N-channel MOS transistor has a gate oxide film having a thickness substantially equal to that of said gate oxide film of said first P-channel MOS transistor.

7. A semiconductor device, comprising:
   a first circuit block having a first complementary MOS transistor including a first P-channel MOS transistor and a first N-channel MOS transistor; and
   a second circuit block having a second complementary MOS transistor including a second P-channel MOS transistor and a second N-channel MOS transistor, threshold voltages of said first P-channel MOS transistor and said first N-channel MOS transistor being set to be higher than those of said second P-channel MOS transistor and said second N-channel MOS transistor, and a gate leakage current of said first N-channel MOS transistor in a stand-by state being set to be substantially equal to that of said first P-channel MOS transistor.

8. The semiconductor device according to claim 7, wherein a thickness of a gate oxide film of said first N-channel MOS transistor is greater than that of said first P-channel MOS transistor.

9. The semiconductor device according to claim 8, wherein a thickness of a gate oxide film of each of said second P-channel MOS transistor and said second N-channel MOS transistor is substantially equal to that of said gate oxide film of said first P-channel MOS transistor.

10. The semiconductor device according to claim 2, wherein said thickness of said gate oxide film of said first P-channel MOS transistor is in the range of 20 to 24 Å, and said thickness of said gate oxide film of said first N-channel MOS transistor is in the range of 25 to 29 Å.

11. The semiconductor device according to claim 5, wherein said thickness of said gate oxide film of said first P-channel MOS transistor is in the range of 20 to 24 Å, and said thickness of said gate oxide film of the first N-channel MOS transistor is in the range of 25 to 29 Å.

12. The semiconductor device according to claim 8, wherein said thickness of said gate oxide film of said first P-channel MOS transistor is in the range of 20 to 24 Å, and said thickness of said gate oxide film of said first N-channel MOS transistor is in the range of 25 to 29 Å.

* * * * *